United States Patent
Shih et al.

(10) Patent No.: US 8,492,857 B2
(45) Date of Patent: Jul. 23, 2013

(54) MEMS DIAPHRAGM

(75) Inventors: Hui-Shen Shih, Changhua County (TW); Yu-Fang Chien, Taipei County (TW)

(73) Assignee: United Microelectronics Corp., Hsinchu (TW)

( * ) Notice: Subject to any disclaimer, the term of this patent is extended or adjusted under 35 U.S.C. 154(b) by 47 days.

(21) Appl. No.: 13/072,368

(22) Filed: Mar. 25, 2011

(65) Prior Publication Data
US 2011/0186945 A1 Aug. 4, 2011

Related U.S. Application Data

(62) Division of application No. 12/248,631, filed on Oct. 9, 2008, now Pat. No. 8,134,215.

(51) Int. Cl.
*H01L 29/06* (2006.01)

(52) U.S. Cl.
USPC .......................................................... 257/419

(58) Field of Classification Search
USPC .......................................................... 257/419
See application file for complete search history.

(56) References Cited

U.S. PATENT DOCUMENTS

| | | | |
|---|---|---|---|
| 5,146,435 A | 9/1992 | Bernstein | 367/181 |
| 5,452,268 A | 9/1995 | Bernstein | 367/181 |
| 5,490,220 A | 2/1996 | Loepperi | 381/168 |
| 5,677,965 A | 10/1997 | Moret et al. | 381/191 |
| 6,483,111 B1 * | 11/2002 | Ishikawa et al. | 250/338.4 |
| 6,535,460 B2 | 3/2003 | Loeppert et al. | 367/181 |
| 6,787,387 B2 * | 9/2004 | Ikushima et al. | 438/57 |
| 6,847,090 B2 | 1/2005 | Loeppert | 257/418 |
| 6,942,750 B2 * | 9/2005 | Chou et al. | 156/272.2 |
| 6,943,448 B2 | 9/2005 | Gabriel et al. | 257/758 |
| 7,362,873 B2 | 4/2008 | Pedersen | 381/175 |
| 7,466,834 B2 | 12/2008 | Ogura et al. | 381/174 |
| 7,536,769 B2 | 5/2009 | Pedersen | 29/594 |
| 7,994,594 B2 * | 8/2011 | Inaba et al. | 257/416 |
| 2002/0151100 A1 | 10/2002 | Coffa et al. | 438/50 |
| 2005/0170656 A1 * | 8/2005 | Nasiri et al. | 438/700 |
| 2006/0093171 A1 * | 5/2006 | Zhe et al. | 381/191 |
| 2006/0210106 A1 * | 9/2006 | Pedersen | 381/355 |
| 2007/0093045 A1 | 4/2007 | Yamaguchi et al. | 438/590 |
| 2007/0190680 A1 * | 8/2007 | Fukuda et al. | 438/50 |
| 2009/0218642 A1 * | 9/2009 | Miller et al. | 257/416 |
| 2009/0243004 A1 | 10/2009 | Lan et al. | |
| 2010/0067728 A1 | 3/2010 | Chen | 381/361 |

* cited by examiner

*Primary Examiner* — Eugene Lee
(74) *Attorney, Agent, or Firm* — J.C. Patents

(57) ABSTRACT

A microelectromechanical system (MEMS) diaphragm is provided. The MEMS diaphragm includes a first conductive layer, a second conductive layer and a first dielectric layer. The first conductive layer is disposed on a substrate and having a plurality of openings. The openings have the same dimension, and the distance between the adjacent openings is gradually increased toward the edge of the first conductive layer. The second conductive layer is disposed between the first conductive layer and the substrate. The first dielectric layer is partially disposed between the first conductive layer and the second conductive layer, so that a portion of the first conductive layer is suspended.

8 Claims, 7 Drawing Sheets

MEMS DIAPHRAGM

CROSS-REFERENCE TO RELATED APPLICATION

This application is a divisional application of and claims the priority benefit of an U.S. application Ser. No. 12/248,631, filed on Oct. 9, 2008 now U.S. Pat. No. 8,134,215. The entirety of the above-mentioned patent application is hereby incorporated by reference herein and made a part of this specification.

BACKGROUND OF THE INVENTION

1. Field of Invention

The present invention relates to a semiconductor device, and more generally to a MEMS diaphragm.

2. Description of Related Art

Micro-electromechanical system (MEMS) devices are mini-electromechanical devices, and the manufacturing technology thereof is similar to that of integrated circuits. With the rapid development of the electronic industry and the manufacturing technology of integrated circuits, the MEMS devices fabricated based on the MEMS technology are varied and include tiny electromechanical devices such as accelerometers, switches, capacitors, sensors and diaphragms. The MEMS devices are widely applicable to electronic products due to the advantages of light weight, small size and excellent quality. For example, the MEMS diaphragms fabricated based on the MEMS technology have become the mainstream in the mini-microphone market, and are applicable to cell phones, digital cameras, cordless headsets, laptops, hearing aids and electronic ears.

Generally speaking, a MEMS diaphragm includes a bottom electrode, a top electrode partially suspended above the bottom electrode, and a dielectric layer between the top and bottom electrodes. In the process of fabricating the MEMS diaphragm, after a bottom electrode, a dielectric material layer and a top electrode having openings are sequentially formed on a substrate, a portion of the dielectric material layer is removed by the etchant such as hydrofluoric acid through the openings in the top electrode, so that a dielectric layer is formed between the top and bottom electrodes. Accordingly, the top electrode is suspended above the bottom electrode and having the vibration property. For example, when the top electrode is vibrated by sound waves, the capacitance between the top and bottom electrodes is changed, and the sound waves are converted to electric signals by the MEMS diaphragm.

However, during the step of removing the portion of the dielectric material layer, the etchant may over-etch the dielectric material layer and even damage the electronic devices around the MEMS diaphragm. Therefore, the device characteristics of the MEMS diaphragms and electronic devices are affected.

SUMMARY OF THE INVENTION

The present invention provides a MEMS diaphragm including a first conductive layer, a second conductive layer and a first dielectric layer. The first conductive layer is disposed on a substrate and having a plurality of openings. The openings have the same dimension, and the distance between the adjacent openings is gradually increased toward the edge of the first conductive layer. The second conductive layer is disposed between the first conductive layer and the substrate. The first dielectric layer is partially disposed between the first conductive layer and the second conductive layer, so that a portion of the first conductive layer is suspended.

According to an embodiment of the present invention, the first conductive layer is shaped as a mesh, for example.

According to an embodiment of the present invention, the first conductive layer includes a plurality of patterns and the openings are disposed between the patterns.

According to an embodiment of the present invention, each pattern includes a winding conductive line.

According to an embodiment of the present invention, the dimensions of the winding conductive lines are the same or different.

According to an embodiment of the present invention, the MEMS diaphragm further includes a second dielectric layer. The second dielectric layer is at least partially disposed between the second conductive layer and the substrate, so that a portion of the second conductive layer is suspended.

According to an embodiment of the present invention, the distances include a plurality of first distances and a plurality of second distances greater than the first distances. Each of the first distances is at a position apart from the edge of the first conductive layer by a distance smaller than a certain value, and each of the second distances is at a position apart from the edge of the first conductive layer by a distance greater than the certain value.

In the present invention, the first conductive layer of the MEMS diaphragm has openings with different dimensions. The dimensions of the openings are gradually reduced toward the edge of the first conductive layer, or the dimensions having a first dimension and the openings having a second dimension are arranged alternately. It is noted that in the process of fabricating the MEMS diaphragm, the configuration of the openings can avoid over-etching of the dielectric material layer of the MEMS diaphragm and prevent the electronic device around the MEMS diaphragm from being damaged. Therefore, the desired device characteristics of the MEMS diaphragm and the adjacent electronic device can be achieved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 1A:
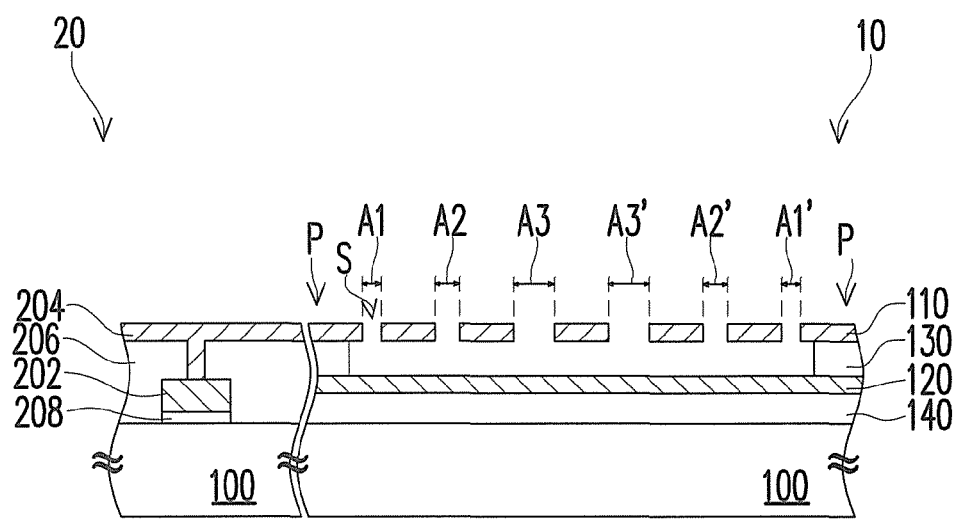
FIG. 1A schematically illustrates a cross-sectional view of a MEMS diaphragm according to a first embodiment of the present invention.
Figure 1B:
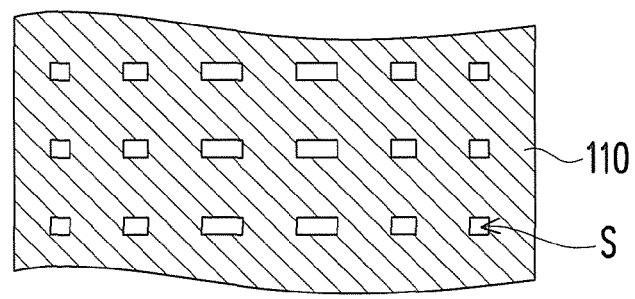
FIG. 1B schematically illustrates a local top view of the MEMS diaphragm in FIG. 1A.

FIG. 1A schematically illustrates a cross-sectional view of a MEMS diaphragm according to a first embodiment of the present invention. FIG. 1B schematically illustrates a local top view of the MEMS diaphragm in FIG. 1A.

Referring to FIGS. 1A and 1B, a MESM diaphragm 10 and an electronic device 20 are respectively disposed in the adjacent regions of a substrate 100. The MEMS diaphragm 10 includes a first conductive layer 110, a second conductive layer 120, a dielectric layer 130 and a dielectric layer 140. The first conductive layer 110 is disposed on the substrate 100. The first conductive layer 110 has a plurality of openings S. The dimensions of the openings S are A1, A2, A3, A1', A2' and A3', which are gradually reduced toward the edge P of the first conductive layer 110. That is, A1<A2<A3 and A1'<A2'<A3'. This embodiment is exemplified, but not limited to, by that A1 is equal to A1', A2 is equal to A2', and A3 is equal to A3'. In this embodiment, the first conductive layer 110 is shaped as a mesh, for example. The first conductive layer 110 includes a conductive material such as polysilicon, polycide, aluminum, tungsten, titanium or copper. The second conductive layer 120 is disposed between the first conductive layer 110 and the substrate 100. The second conductive layer 120 includes a conductive material such as polysilicon, polycide, aluminum, tungsten, titanium or copper. In this embodiment, the second conductive layer 120 is a whole piece of the conductive layer, for example. In another embodiment (not shown), the second conductive layer 120 can be shaped as a mesh or other shapes.

In this embodiment, the dielectric layer 130 is partially disposed between the first conductive layer 110 and the second conductive layer 120, so that a portion the first conductive layer 110 is suspended. The dielectric layer 140 is disposed between the second conductive layer 120 and the substrate 100. In another embodiment (not shown), the dielectric layer 140 can be partially disposed between the second conductive layer 120 and the substrate 100, so that a portion the second conductive layer 120 is suspended above the substrate 100. The dielectric layers 130 and 140 respectively include a dielectric material such as silicon oxide, un-doped silicon glass (USG), borophosphosilicate glass (BPSG) or phosphosilicate glass (PSG).

In this embodiment, the electronic device 20 may be a complementary metal-oxide-semiconductor (CMOS) device and disposed around the MEMS diaphragm 10. In other words, the edge P of the MEMS diaphragm 10 is adjacent to the electronic device 20. The electronic device 20 includes a gate 202 disposed on the substrate 100, an interconnection layer 204 electronically connected to the gate 202, a dielectric layer 206 and a dielectric layer 208. The dielectric layer 206 is disposed between the gate 202 and the interconnection layer 204. The dielectric layer 208 is disposed between the gate 202 and the substrate 100. The material of the dielectric layers 206 and 208 may be the same as that of the dielectric layers 130 and 140. The dielectric layer 208 includes silicon oxide, and the dielectric layer 206 includes a dielectric material such as silicon oxide, USG, BPSG or PSG, for example.

Generally speaking, in the process of fabricating the MEMS diaphragm 10, after a second conductive layer 120, a dielectric material layer (not shown) and a first conductive layer 110 are sequentially formed on the substrate 100, a potion of the dielectric material layer is removed by the ethant such as hydrofluoric acid through the openings S in the first conductive layer 110, so as to form a dielectric layer 130 partially disposed between the first conductive layer 110 and the second conductive layer 120, and thus, a portion of the first conductive layer 110 is suspended. In this embodiment, the dimensions of the openings S are gradually reduced toward the edge P of the first conductive layer 110, so as to effectively avoid over-etching of the dielectric material layer as well as etching of the dielectric layer 206 of the electronic device 20 when the etchant is used. In other words, the configuration of the openings in the first conductive layer can prevent the MEMS diaphragm and the adjacent electronic device from being damaged by the etchant, so that the desired device characteristics of the MEMS diaphragm and the electronic device can be achieved. Further, the membrane stress of the first conductive layer can be increased by the dimension change of the openings in the first conductive layers, so as to enhance the device characteristics of the MEMS diaphragm.

Second Embodiment

Figure 2A:
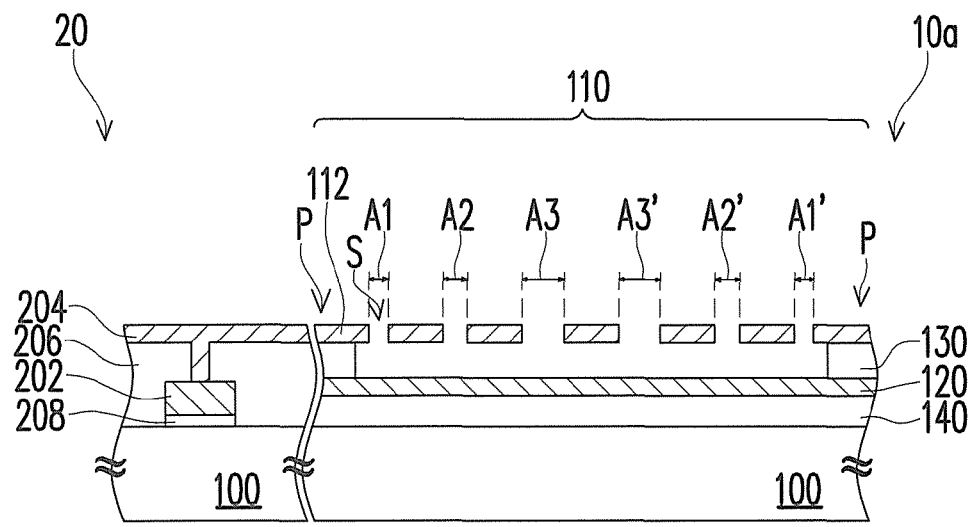
FIG. 2A schematically illustrates a cross-sectional view of a MEMS diaphragm according to a second embodiment of the present invention.
Figure 2B:
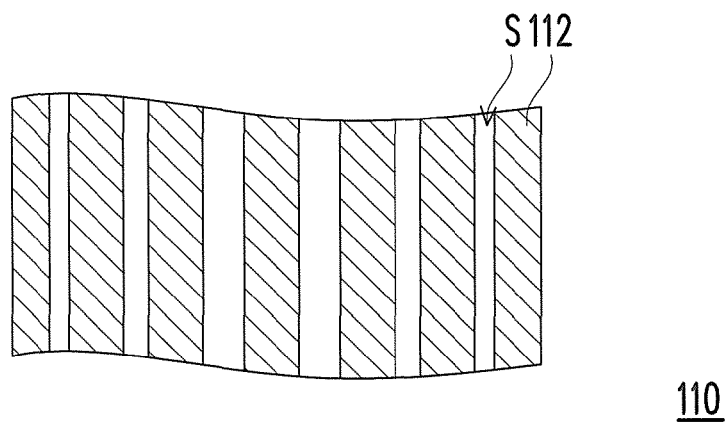
FIG. 2B schematically illustrates a local top view of the MEMS diaphragm in FIG. 2A.

FIG. 2A schematically illustrates a cross-sectional view of a MEMS diaphragm according to a second embodiment of the present invention. FIG. 2B schematically illustrates a local top view of the MEMS diaphragm in FIG. 2A. The structure of the MEMS diaphragm 10a in the second embodiment is similar to that of the MEMS structure diaphragm 10 in the first embodiment, and the difference is illustrated in the following.

Referring to FIGS. 2A and 2B, the first conductive layer 110 includes a plurality of patterns 112 and a plurality of openings S between the patterns 112. The dimensions of the openings S are A1, A2, A3, A1', A2' and A3', which are gradually reduced toward the edge P of the first conductive layer 110. That is, A1<A2<A3 and A1'<A2'<A3'. This embodiment is exemplified, but not limited to, by that A1 is equal to A1', A2 is equal to A2', and A3 is equal to A3'. It is noted that this embodiment in which each pattern 112 is shaped as a stripe is provided for illustration purposes and is not to be construed as limiting the present invention. In another embodiment (not shown), the patterns 112 can have other shapes.

Third Embodiment

Figure 3A:
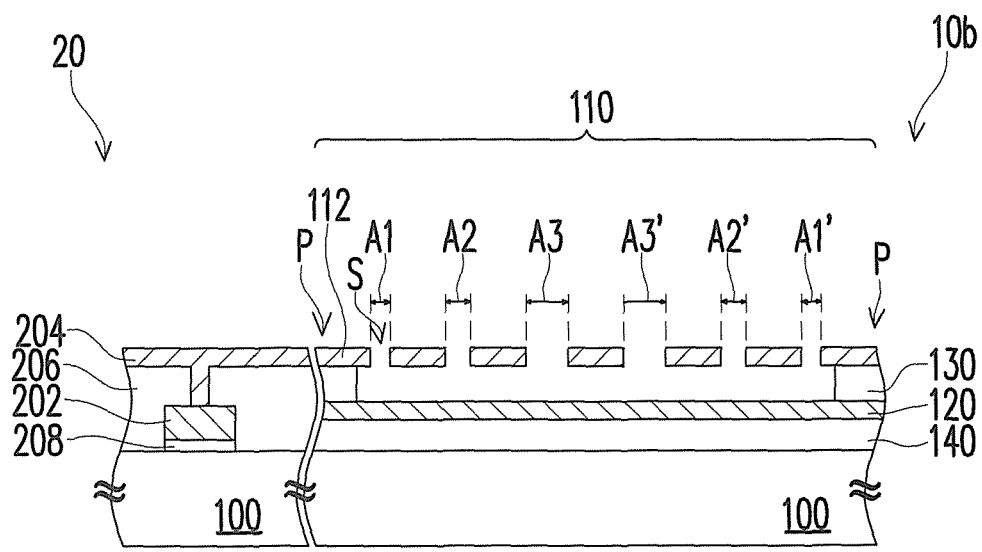
FIG. 3A schematically illustrates a cross-sectional view of a MEMS diaphragm according to a third embodiment of the present invention.
Figure 3B:
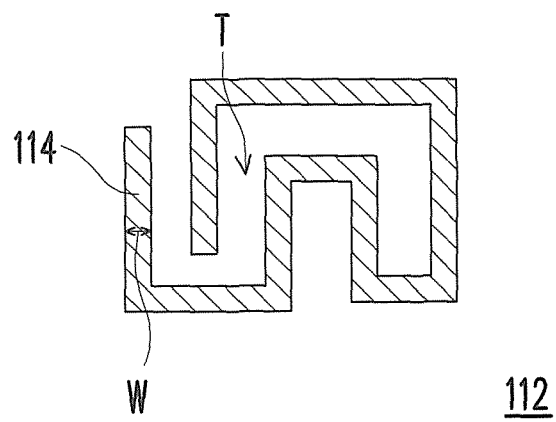
FIG. 3B schematically illustrates a top view of each pattern 112 of the MEMS diaphragm in FIG. 3A.

FIG. 3A schematically illustrates a cross-sectional view of a MEMS diaphragm according to a third embodiment of the present invention. FIG. 3B schematically illustrates a top view of each pattern 112 of the MEMS diaphragm in FIG. 3A.

The structure of the MEMS diaphragm 10b in the third embodiment is similar to that of the MEMS structure diaphragm 10 in the first embodiment, and the difference is illustrated in the following.

Referring to FIGS. 3A and 3B, the first conductive layer 110 includes a plurality of patterns 112 arranged in array and a plurality of openings S between the patterns 112. The dimensions of the openings S are A1, A2, A3, A1', A2' and A3', which are gradually reduced toward the edge P of the first conductive layer 110. That is, A1<A2<A3 and A1'<A2'<A3'. This embodiment is exemplified, but not limited to, by that A1 is equal to A1', A2 is equal to A2', and A3 is equal to A3'. Further, each pattern 112 includes a winding conductive line 114 and an opening T. This embodiment in which the line width W of the conductive line 114 and the dimension of the opening T are fixed in each pattern 112 is provided for illustration purposes, and is not to be construed as limiting the present invention. In details, the dimension of the opening T can be changed as the line width W of the conductive line 114 is changed. For example, when the total area occupied by the conductive line 114 and the opening T is constant, the dimension of the opening T is getting smaller as the line width W of the conductive line 114 is getting larger, and vice versa. Accordingly, the membrane stress of the first conductive layer can be further adjusted to enhance the device characteristics of the MEMS diaphragm. This embodiment in which the dimensions of the patterns 112 are the same is provided for illustration purposes, and is not to be construed as limiting the present invention. It is appreciated by persons skilled in the art that the dimensions of the patterns 112 can be different upon the design requirement.

Fourth Embodiment

Figure 4A:
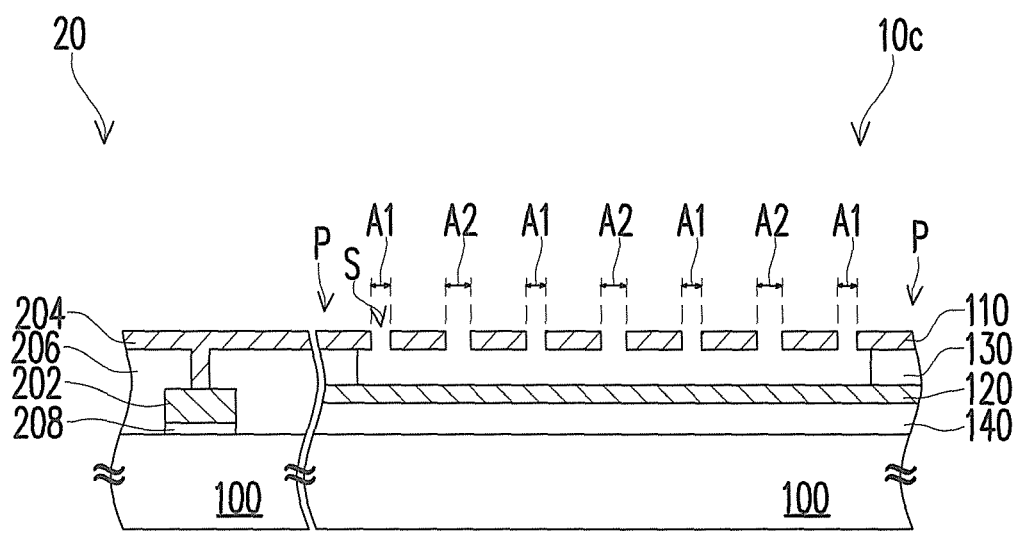
FIG. 4A schematically illustrates a cross-sectional view of a MEMS diaphragm according to a fourth embodiment of the present invention.
Figure 4B:
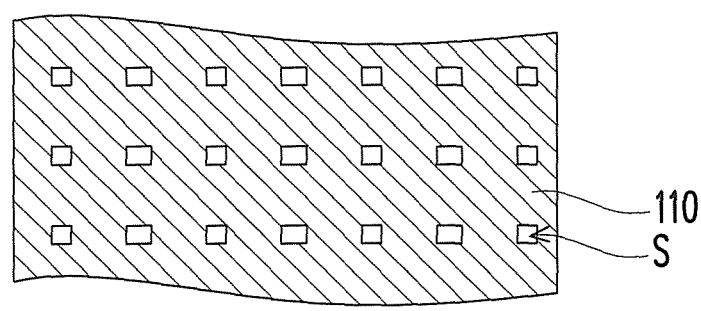
FIG. 4B schematically illustrates a local top view of the MEMS diaphragm in FIG. 4A.

FIG. 4A schematically illustrates a cross-sectional view of a MEMS diaphragm according to a fourth embodiment of the present invention. FIG. 4B schematically illustrates a local top view of the MEMS diaphragm in FIG. 4A. The structure of the MEMS diaphragm 10c in the fourth embodiment is similar to that of the MEMS structure diaphragm 10 in the first embodiment, and the difference is illustrated in the following.

Referring to FIGS. 4A and 4B, the first conductive layer 110 includes a plurality of openings S. The openings S having a first dimension A1 and the openings S having a second dimension A2 are arranged alternately, and the first dimension A1 is not equal to the second dimension A2. In details, the dimensions of openings S are sequentially A1, A2, A1, A2, A1, A2 . . . counting form the edge P of the first conductive layer 110. In this embodiment, the first dimension A1 is smaller than the second dimension A2, for example. In another embodiment (not shown), the first dimension A1 can be greater than the second dimension A2. It is noted that this embodiment in which the openings have two dimensions is provided for illustration purposes and is not to be construed as limiting the present invention. In another embodiment (not shown), the openings can have more than two dimensions. For example, the dimensions of openings S are sequentially A1, A2, A3, A1, A2, A3 . . . or A1, A2, A3, A4, A1, A2, A3, A4 . . . counting form the edge of the first conductive layer. Further, the dimensions of the openings can be not completely the same. For example, the dimensions of openings S are sequentially A1, A2, A1', A2', A1", A2" A1, A2, A1', A2', A1", A2" . . . counting form the edge of the first conductive layer, wherein A1<A2, A1'<A2' and A1"<A2".

In this embodiment, the openings having a small dimension and the openings having a large dimension are arranged alternately, so as to control the flow rate and flow volume of the etchant entering the dielectric material layer through the openings. Therefore, when the etchant is used, over-etching of the dielectric material layer at the edge P as well as etching of the dielectric layer 206 of the electronic device 20 can be effectively avoided. In other words, the configuration of the openings in the first conductive layer can prevent the MEMS diaphragm and the adjacent electronic device from being damaged by the etchant, so as to achieve the desired device characteristics of the MEMS diaphragm and the electronic device. Further, the membrane stress of the first conductive layer can be increased by the dimension change of the openings in the first conductive layers, so as to enhance the device characteristics of the MEMS diaphragm.

Fifth Embodiment

Figure 5:
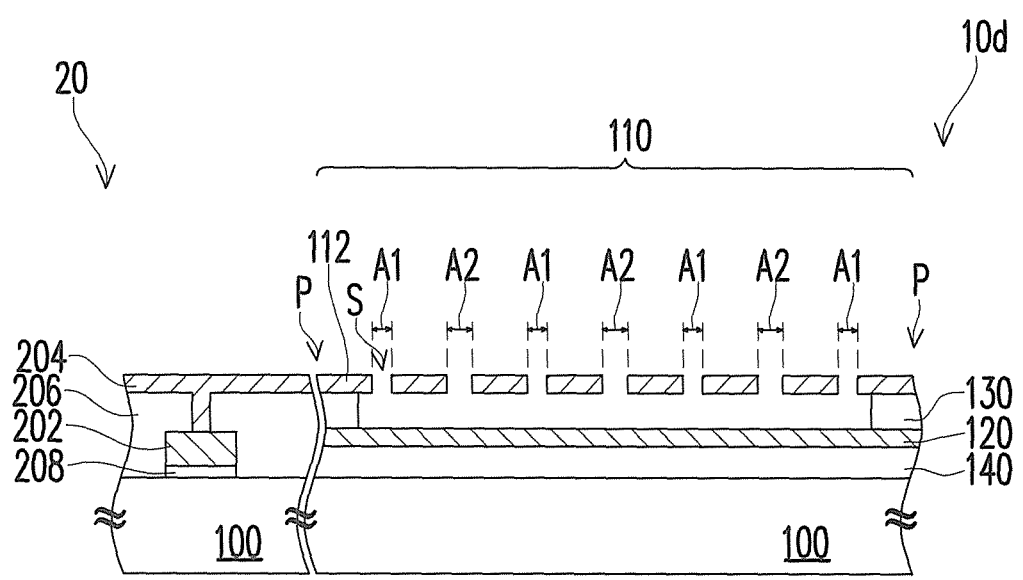
FIG. 5 schematically illustrates a cross-sectional view of a MEMS diaphragm according to a fifth embodiment of the present invention.

FIG. 5 schematically illustrates a cross-sectional view of a MEMS diaphragm according to a fifth embodiment of the present invention. The structure of the MEMS diaphragm 10d in the fifth embodiment is similar to that of the MEMS structure diaphragm 10c in the fourth embodiment, and the difference is illustrated in the following.

Referring to FIG. 5, the first conductive layer 110 includes a plurality of patterns 112 and a plurality of openings S between the patterns 112. The openings S having a first dimension A1 and the openings S having a second dimension A2 are arranged alternately, and the first dimension A1 is not equal to the second dimension A2. In details, the dimensions of the openings S are subsequently A1, A2, A1, A2, A1, A2 . . . counting from the edge P of the first conductive layer 110. It is noted that this embodiment in which the openings have two dimensions is provided for illustration purposes and is not to be construed as limiting the present invention. In another embodiment (not shown), the openings can have more than two dimensions, and the possible configurations of the openings are mentioned in the fourth embodiment; thus, the details are not iterated. Further, each pattern 112 can be shaped as a stripe (FIG. 2B), a winding line (FIG. 3B) or other shapes, which are mentioned in the second and third embodiments, and thus the details are not iterated.

Sixth Embodiment

Figure 6:
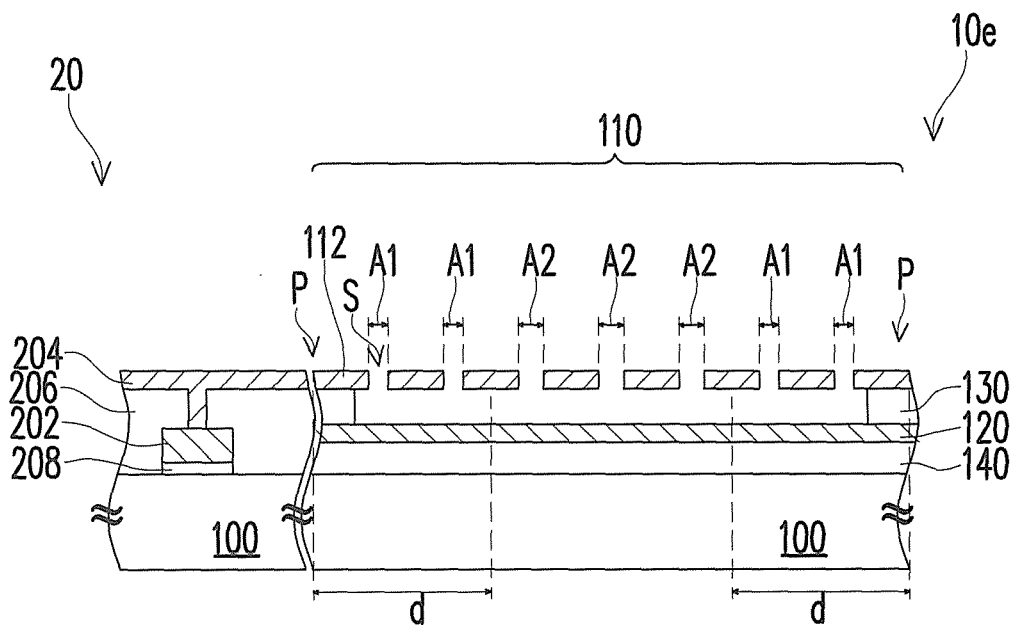
FIG. 6 schematically illustrates a cross-sectional view of a MEMS diaphragm according to a sixth embodiment of the present invention.

FIG. 6 schematically illustrates a cross-sectional view of a MEMS diaphragm according to a sixth embodiment of the present invention. The structure of the MEMS diaphragm 10e in the sixth embodiment is similar to that of the MEMS structure diaphragm 10a in the second embodiment, and the difference is illustrated in the following.

Referring to FIG. 6, the first conductive layer 110 includes a plurality of patterns 112 and a plurality of openings S between the patterns 112. In this embodiment, the openings S have two dimensions A1 and A2, and A1<A2. When the distance between an opening S and the edge P of the first conductive layer 110 is smaller than a certain value d, the dimension of the opening S is A1. When the distance between an opening S and the edge P of the first conductive layer 110 is greater than the certain value d, the dimension of the opening S is A2. In other words, a group of the openings S closer to the edge P of the first conductive layer 110 have a smaller dimension, but another group of the openings S away from the edge P of the first conductive layer 110 have a larger dimension. This embodiment in which the openings have two dimensions is provided for illustration purposes and is not to be construed as limiting the present invention. In another embodiment (not shown), the openings can be divided into a plurality of groups, and the dimensions of groups of openings are gradually reduced toward the edge of the first conductive layer. Further, each pattern 112 can be shaped as a stripe (FIG. 2B), a winding line (FIG. 3B) or other shapes, which are mentioned in the second and third embodiments, and thus the details are not iterated.

Seventh Embodiment

Figure 7:
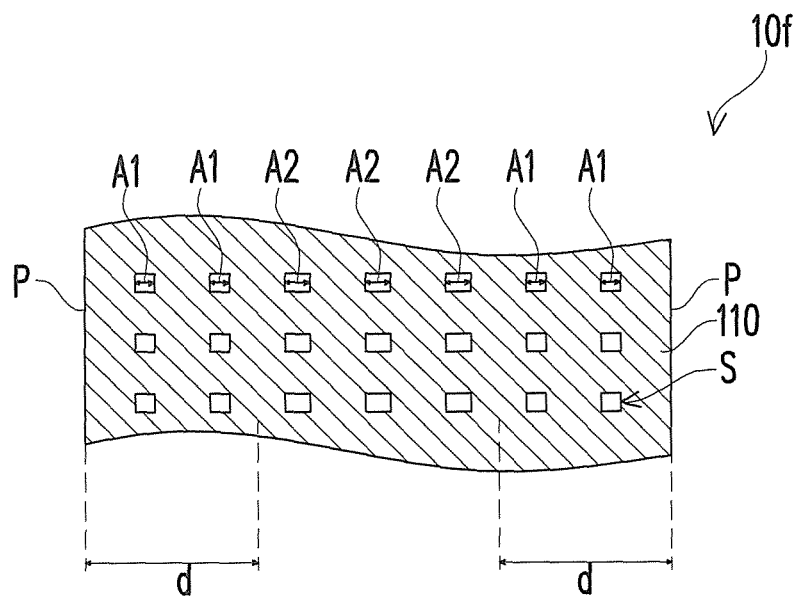
FIG. 7 schematically illustrates a local top view of a MEMS diaphragm according to a seventh embodiment of the present invention.

FIG. 7 schematically illustrates a local top view of a MEMS diaphragm according to a seventh embodiment of the present invention. The structure of the MEMS diaphragm 10f in the seventh embodiment is similar to that of the MEMS structure diaphragm 10 in the first embodiment, and the difference is illustrated in the following.

Referring to FIG. 7, in this embodiment, the openings S have two dimensions A1 and A2, and A1<A2. When the distance between an opening S and the edge P of the first conductive layer 110 is smaller than a certain value d, the dimension of the opening S is A1. When the distance between an opening S and the edge P of the first conductive layer 110 is greater than the certain value d, the dimension of the opening S is A2. In other words, a group of the openings S closer to the edge P of the first conductive layer 110 have a smaller dimension, but another group of the openings S away from the edge P of the first conductive layer 110 have a larger dimension. This embodiment in which the openings have two dimensions is provided for illustration purposes and is not to be construed as limiting the present invention. In another embodiment (not shown), the openings can be divided into a plurality of groups, and the dimensions of groups of openings are gradually reduced toward the edge of the first conductive layer.

Eighth Embodiment

Figure 8:
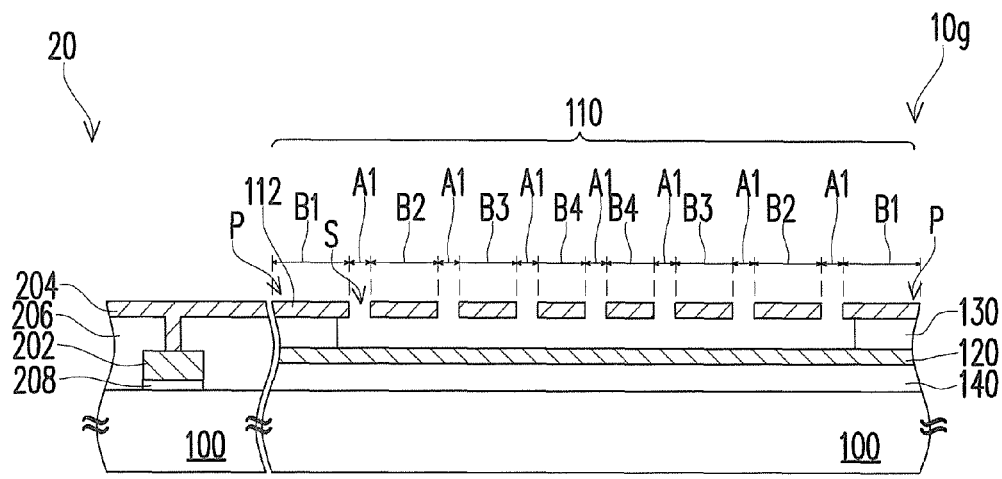
FIG. 8 schematically illustrates a cross-sectional view of a MEMS diaphragm according to an eighth embodiment of the present invention.

FIG. 8 schematically illustrates a cross-sectional view of a MEMS diaphragm according to an eighth embodiment of the present invention. The structure of the MEMS diaphragm 10g in the eighth embodiment is similar to that of the MEMS structure diaphragm 10a in the second embodiment, and the difference is illustrated in the following.

Referring to FIG. 8, the first conductive layer 110 includes a plurality of patterns 112 and a plurality of openings S between the patterns 112. In this embodiment, the openings S have the same dimension A1. The dimensions of the patterns 112 are B1, B2, B3 and B4, which are gradually increased toward the edge P of the first conductive layer 110. That is, B1>B2>B3>B4. In another embodiment (not shown), the patterns 112 have two dimensions B1 and B2, and B1>B2. When the distance between a pattern 112 and the edge P of the first conductive layer 110 is smaller than a certain value d, the dimension of the pattern 112 is B1. When the distance between a pattern 112 and the edge P of the first conductive layer 110 is greater than the certain value d, the dimension of the pattern 112 is B2. Further, each pattern 112 can be shaped as a stripe (FIG. 2B), a winding line (FIG. 3B) or other shapes, which are mentioned in the second and third embodiments, and thus the details are not iterated.

Ninth Embodiment

Figure 9:
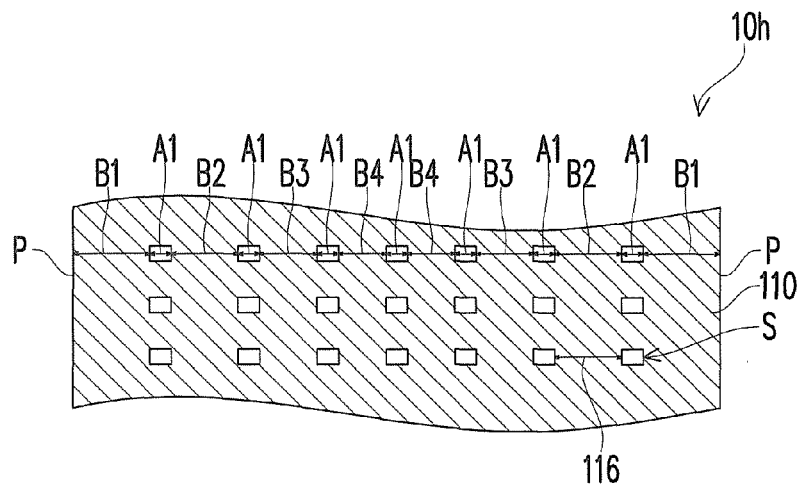
FIG. 9 schematically illustrates a local top view of a MEMS diaphragm according to a ninth embodiment of the present invention.

FIG. 9 schematically illustrates a local top view of a MEMS diaphragm according to a ninth embodiment of the present invention. The structure of the MEMS diaphragm 10h in the seventh embodiment is similar to that of the MEMS structure diaphragm 10 in the first embodiment, and the difference is illustrated in the following.

Referring to FIG. 9, in this embodiment, the openings S have the same dimension A1. The distance 116 between the adjacent openings S is gradually increased toward the edge P of the first conductive layer 110; that is, B1>B2>B3>B4. In another embodiment (not shown), the distances 116 have two values B1 and B2, and B1>B2. When a distance 116 is at a position apart from the edge P of the first conductive layer 110 by a distance smaller than a certain value d, the distance 116 is B2. When a distance 116 is at a position apart from the edge P of the first conductive layer 110 by a distance greater than the certain value d, the distance 116 is B2.

In another embodiment, it is noted that the MEMS diaphragm includes a plurality of sub-units, and each of the sub-units can be the smallest unit for forming the MEMS diaphragm. Each of the sub-units includes the above-mentioned openings or patterns.

In summary, the first conductive layer of the MEMS diaphragm of the present invention has openings with different dimensions. The dimensions of the openings are gradually reduced toward the edge of the first conductive layer, or the dimensions having a small dimension and the openings having a large dimension are arranged alternately. The configuration of the openings can avoid over-etching of the dielectric material layer of the MEMS diaphragm and prevent the electronic device around the MEMS diaphragm from being damaged. Further, the membrane stress of the first conductive layer can be increased by the dimension change of the openings in the first conductive layer, so as to further enhance the device characteristics of the MEMS diaphragm. Therefore, the desired device characteristics of the MEMS diaphragm and the adjacent electronic device can be achieved.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A MEMS diaphragm, comprising:
   a first conductive layer, disposed on a substrate and having a plurality of openings, wherein the openings have the same dimension, and distances between the adjacent openings are gradually increased toward an edge of the first conductive layer;
   a second conductive layer, disposed between the first conductive layer and the substrate, wherein the second conductive layer is a film with no opening and the openings of the first conductive layer are completely overlapped with the film; and
   a first dielectric layer, partially disposed between the first conductive layer and the second conductive layer, so that a portion of the first conductive layer is suspended.

2. The MEMS diaphragm of claim 1, wherein the first conductive layer is shaped as a mesh.

3. The MEMS diaphragm of claim 1, wherein the first conductive layer comprises a plurality of patterns and the openings are disposed between the patterns.

4. The MEMS diaphragm of claim 3, wherein each pattern comprises a winding conductive line.

5. The MEMS diaphragm of claim 4, wherein dimensions of the winding conductive lines are the same or different.

6. The MEMS diaphragm of claim 1, further comprising a second dielectric layer, at least partially disposed between the second conductive layer and the substrate, so that a portion of the second conductive layer is suspended.

7. The MEMS diaphragm of claim 1, wherein the distances comprise a plurality of first distances and a plurality of second distances smaller than the first distances, each of the first distances is at a position apart from the edge of the first conductive layer by a distance smaller than a certain value, and each of the second distances is at a position apart from the edge of the first conductive layer by a distance greater than the certain value.

8. The MEMS diaphragm of claim 1, wherein the distances at least includes a first distance, a second distance and a third distance which are different.

* * * * *